(12) United States Patent
Hsu et al.

(10) Patent No.: US 10,192,933 B2
(45) Date of Patent: Jan. 29, 2019

(54) ORGANIC LIGHT EMITTING DEVICE AND METHOD FOR MANUFACTURING THE SAME

(71) Applicant: Wuhan China Star Optoelectronics Technology Co., Ltd., Wuhan, Hubei (CN)

(72) Inventors: Hsiang Lun Hsu, Guangdong (CN); Meng Zhao, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 81 days.

(21) Appl. No.: 15/504,332

(22) PCT Filed: Dec. 26, 2016

(86) PCT No.: PCT/CN2016/112161
§ 371 (c)(1),
(2) Date: Feb. 16, 2017

(87) PCT Pub. No.: WO2018/112992
PCT Pub. Date: Jun. 28, 2018

(65) Prior Publication Data
US 2018/0226456 A1    Aug. 9, 2018

(30) Foreign Application Priority Data

Dec. 21, 2016  (CN) .......................... 2016 1 1188951

(51) Int. Cl.
*H01L 51/50*   (2006.01)
*H01L 27/32*   (2006.01)
(Continued)

(52) U.S. Cl.
CPC ...... *H01L 27/3209* (2013.01); *H01L 51/0018* (2013.01); *H01L 51/5004* (2013.01);
(Continued)

(58) Field of Classification Search
CPC . H01L 51/50; H01L 51/5004; H01L 51/5036; H01L 51/0064; H01L 51/5072; H01L 51/5265
See application file for complete search history.

(56) References Cited

U.S. PATENT DOCUMENTS

2003/0230967 A1* 12/2003 Kawamura ............ B41M 3/006
                                                313/483
2007/0190359 A1*  8/2007 Knowles ............. C07F 15/0033
                                                428/690

(Continued)

FOREIGN PATENT DOCUMENTS

CN       102931361 A     2/2013
CN       103021334 A     4/2013
(Continued)

*Primary Examiner* — Phuc Dang
(74) *Attorney, Agent, or Firm* — Andrew C. Cheng (57) ABSTRACT

The present disclosure discloses a manufacturing method of organic light emitting device, and the steps of the manufacturing method comprises: manufacturing a bottom electrode on a base substrate; manufacturing an organic electro-emitting assembly on the bottom electrode by evaporation techniques and lithography techniques; and manufacturing a top electrode on the organic electro-emitting assembly. An organic light emitting device manufactured by the aforementioned method is further disclosed in the present invention. Hole transport layers corresponded to every emitting layers is manufactured by lithography technologies in the present disclosure; therefore, no fine metal mask is needed in use to reduce production cost and time; furthermore, properties of the organic light emitting device is increased simultaneously.

14 Claims, 9 Drawing Sheets

(51) Int. Cl.
   *H01L 51/52* (2006.01)
   *H01L 51/56* (2006.01)
   *H01L 51/00* (2006.01)

(52) U.S. Cl.
   CPC ...... *H01L 51/5036* (2013.01); *H01L 51/5064* (2013.01); *H01L 51/5072* (2013.01); *H01L 51/5088* (2013.01); *H01L 51/5265* (2013.01); *H01L 51/56* (2013.01)

(56) References Cited

U.S. PATENT DOCUMENTS

2013/0026521 A1* 1/2013 Lee .................. H01L 51/5212
                                                    257/98
2015/0111330 A1  4/2015 Harikrishna Mohan

FOREIGN PATENT DOCUMENTS

| CN | 103022381 A | 4/2013 |
| CN | 103579522 A | 2/2014 |
| CN | 104752460 A | 7/2015 |
| KR | 20150113422 A | 10/2015 |

* cited by examiner

ORGANIC LIGHT EMITTING DEVICE AND METHOD FOR MANUFACTURING THE SAME

TECHNICAL FIELD

The disclosure relates to organic electro-emitting technical field, more particularly, to organic light emitting device and method for manufacturing the same.

DESCRIPTION OF RELATED ART

In recent years, Organic Light-Emitting Diode (OLED) becomes very popular emerging products of flat panel display at home and abroad because OLED display has the characteristics of self-luminous, wide viewing angle (over 175°), short response time (1 µs), high luminous efficiency, wide gamut, low operating voltage (3~10V), thin thickness (less than 1 mm), large-size availability, flexible panel, and simplified process, and OLED also has the potential of low cost.

Currently, OLED is compose of different functions of multi-layer structure. The inherent properties of the material used in each layer structure and compatibility hereof with the materials used in the other layer structures are very important. The multi-layer structure usually comprises a hole injection layer (HIL), a hole transport layer (HTL), a emitting layer (EML), a electron transport layer (ETL), a electron injection layer (EIL) and so on. Multi-color OLED based on red, green and blue colors can adjust microcavity effects of OLED unit by adjusting thickness of different layer to achieve improving lighting efficiency and adjusting narrow spectral width of every color of light. For example, we could adjust thickness of hole transport layers corresponding to red, green and blue emitting layer to adjust spectral width of emitting light of three colors for achieving the color balancing. In this kind of design, the hole transport layer cannot be evaporated as common layer, and fine metal mask is needed to be used. This is not only increases the time of the process technology, but also increases the cost of OLED according to cleaning problem of fine metal mask. Furthermore, due to alignment issue of using fine metal mask, the production success rate of OLE will be reduced greatly.

BRIEF SUMMARY

In order to solve the aforementioned problem existing in prior art, an object of the present disclosure is to provide an organic light emitting device without using fine metal mask and a manufacturing method thereof.

According to one aspect of the present disclosure, a manufacturing method of organic light emitting device is provided, and comprising steps as following: manufacturing a bottom electrode on a base substrate; manufacturing an organic electro-emitting assembly on the bottom electrode by evaporation techniques and lithography techniques; manufacturing a top electrode on the organic electro-emitting assembly.

Particularly, the step of the method of manufacturing an organic electro-emitting assembly on the bottom electrode by evaporation techniques and lithography techniques comprise the following step: evaporating a hole injection layer on the bottom electrode; manufacturing hole transport layers corresponding respectively to varies color lights emitted from emitting layers on the hole injection layer by lithography technologies on a needed thickness of resonance mode; evaporating corresponding emitting layers on the hole transport layers; evaporating an electron transport layer on the emitting layer; evaporating an electron injection layer on the electron transport layer.

Particularly, the emitting layers capable of emitting varies color lights comprise: a first emitting layer capable of emitting red light, a second emitting layer capable of emitting green light and a third emitting layer capable of emitting blue light.

Particularly, the step of the method of manufacturing the hole transport layer corresponding to red color lights emitted by lithography technologies on the hole injection layer on the needed thickness of resonance mode comprise the following steps: evaporating an organic material layer on the hole injection layer according to the needed thickness of the resonance mode for the hole transport layer corresponding to the first emitting layer; coating a photoresist layer on the organic material layer; developing the photoresist layer by a first photomask; wherein the first photomask is partially light transparent and partially (the rest of the first photomask) opaque to the first emitting layer; developing the photoresist layer after exposing to remove the un-exposing photoresist layer; etching the organic material layer uncovered by the photoresist layer; isolating the exposing photoresist layer to form the hole transport layer corresponding to the first emitting layer.

Particularly, the step of the method of manufacturing the hole transport layer corresponding to the second emitting layer emitting green light by lithography technologies on the needed thickness of resonance mode for the hole injection layer comprises the following steps: evaporating an organic material layer on the hole injection layer according to the needed thickness of the resonance mode for the hole transport layer corresponding to the second emitting layer; coating a photoresist layer on the organic material layer; developing the photoresist layer by a second photomask; wherein the second photomask is partially light transparent and partially (the rest of the second photomask) opaque to the second emitting layer; developing the photoresist layer after exposing to remove the un-exposing photoresist layer; etching the organic material layer uncovered by the photoresist layer; isolating the exposing photoresist layer to form the hole transport layer corresponding to the second emitting layer.

Particularly, the step of the method of manufacturing the hole transport layer corresponding to the third emitting layer emitting green light by lithography technologies on the needed thickness of resonance mode for the hole injection layer comprise the following steps: evaporating an organic material layer on the hole injection layer according to the needed thickness of the resonance mode for the hole transport layer corresponding to the third emitting layer; coating a photoresist layer on the organic material layer; developing the photoresist layer by a third photomask; wherein the third photomask is partially light transparent and partially (the rest of the third photomask) opaque to the third emitting layer; developing the photoresist layer after exposing to remove the un-exposing photoresist layer; etching the organic material layer uncovered by the photoresist layer; isolating the exposing photoresist layer to form the hole transport layer corresponding to the third emitting layer.

Particularly, the photoresist layer is made from negative photoresist materials.

Particularly, the needed thickness of the resonance mode for the hole transport layer corresponding to the third emitting layer is larger than the needed thickness of the resonance mode for the hole transport layer corresponding to the second emitting layer, and the needed thickness of the resonance mode for the hole transport layer corresponding to the second emitting layer is larger than the needed thickness of the resonance mode for the hole transport layer corresponding to the first emitting layer.

Particularly, one of the bottom electrode and the top electrode is transparent or semi-transparent, and the other one is opaque and reflective.

According to another aspect of the present disclosure, an organic light emitting device manufactured by the manufacturing method of organic light emitting device is further provided in the present disclosure.

Advantage effects of the present disclosure: lithography technologies utilized in manufacturing hole transport layers corresponding to varies emitting layers without using fine metal mask; therefore, technical cost and time is saved, and efficiencies of the organic light emitting device are increased simultaneously.

BRIEF DESCRIPTION OF THE DRAWINGS

The above and other aspects, features and advantages of the embodiments of the invention will become more apparent from the following description, taken in conjunction with the accompanying drawing of which.

DETAILED DESCRIPTION

In the following, various embodiments of the present disclosure will be described in detail with reference to accompanying drawings. The present disclosure may be embodied in many different forms and should not be construed as limiting to the embodiments set forth herein. Rather these embodiments are provided to explain the principles of the present disclosure and its practical application, so that other skilled in the art can understand various embodiments of the present disclosure and various modifications suitable for specific intended applications.

In the drawings, the thickness of layer and regions are exaggerated for clarity. The same reference numerals will be used throughout the drawings and the specification to refer to the same components.

An organic electro-emitting assembly (or named organic EL element) means one organic layer or a plurality of layers between two electrodes to enable emitting with out-coming voltage.

Figure 1A:
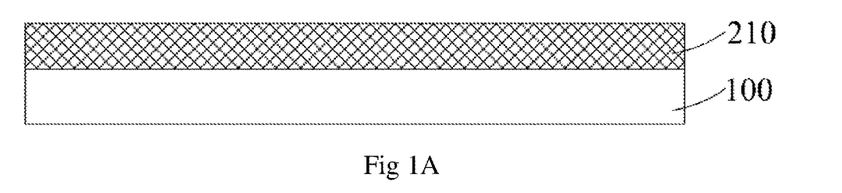
FIG. 1A~FIG. 1C represent process diagrams of an organic light emitting device according to an embodiment of the present disclosure.
Figure 1B:
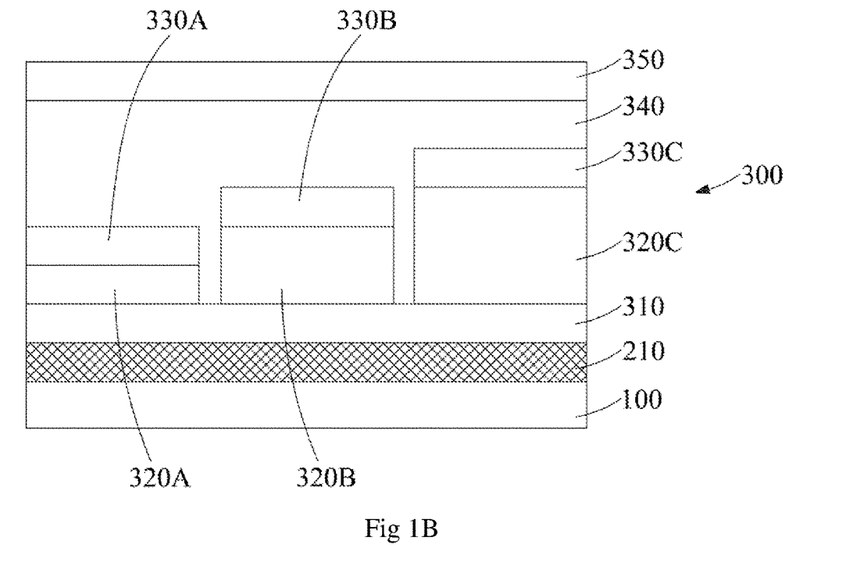
Figure 1C:
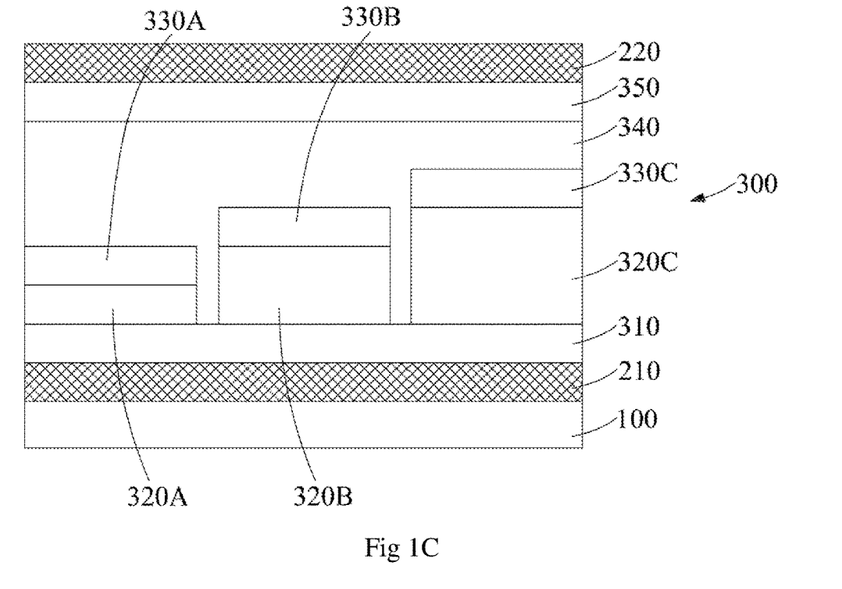

FIG. 1A~FIG. 1C represent process diagrams of an organic light emitting device according to an embodiment of the present disclosure.

Please refer to FIG. 1A, a bottom electrode 210 is manufactured on a base substrate 100.

The base substrate 100 can be transparent or oblique. Related to observing emitting on an organic electro-emitting assembly through the base substrate 100, the base substrate 100 is transparent. Transparent glass or plastic is often to be applied in this situation. Related to observing emitting on an organic electro-emitting assembly through the top electrode, the base substrate 100 is transparent, light-absorbing or reflective. Materials applied in this situation comprises glass, plastic, semiconductor material, ceramics, circuit board material or any other applicable materials, but not limited hereto.

The bottom electrode 210 is often disposed as anode, and the bottom electrode 210 is also a reflective mirror. When observing emitting from the organic electro-emitting assembly through the base substrate 100, the bottom electrode 210 can be made of reflective metal and should be able to thin enough to comprise partial transparency rate under emitting-light wave; this is so called semi-transparent. Or the bottom electrode 210 can be made of transparent metal oxides, for example: Indium-Tin-Oxide or Zinc-Tin-Oxide. When observing emitting from the organic electro-emitting assembly through the top electrode, the bottom electrode 210 is made of reflective metal, and the bottom electrode 210 should be thick enough to stop light passing and to be a light-reflective mirror hereto.

Please refer to FIG. 1B, an organic electro-emitting assembly 300 (or named organic EL element) is manufactured on the bottom electrode 210 by evaporation techniques and lithography techniques. The manufacturing method of the organic electro-emitting assembly is described in detail as following.

FIG. 2A~FIG. 2E represent process diagrams of an organic electro-emitting assembly according to an embodiment of the present disclosure.

Figure 2A:
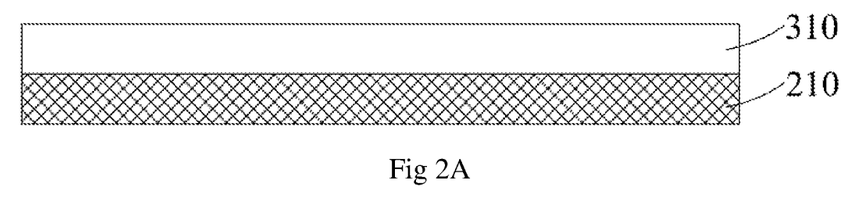
FIG. 2A~FIG. 2E represent process diagrams of an organic electro-emitting assembly according to an embodiment of the present disclosure.

Please refer to FIG. 2A, a hole injection layer (HIL) 310 is evaporated on the bottom electrode 210. The hole injection layer 310 is used to increase film-forming property for further organic layers, and is facilitated to inject hole into the hole transport layer (HTL).

Figure 2B:
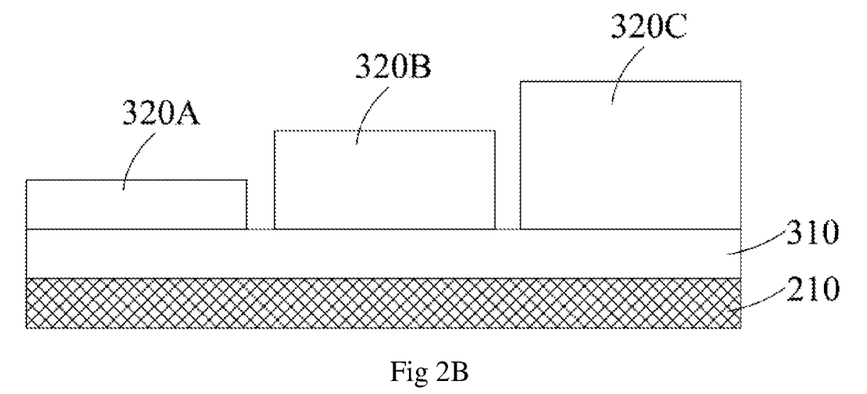
Figure 2C:
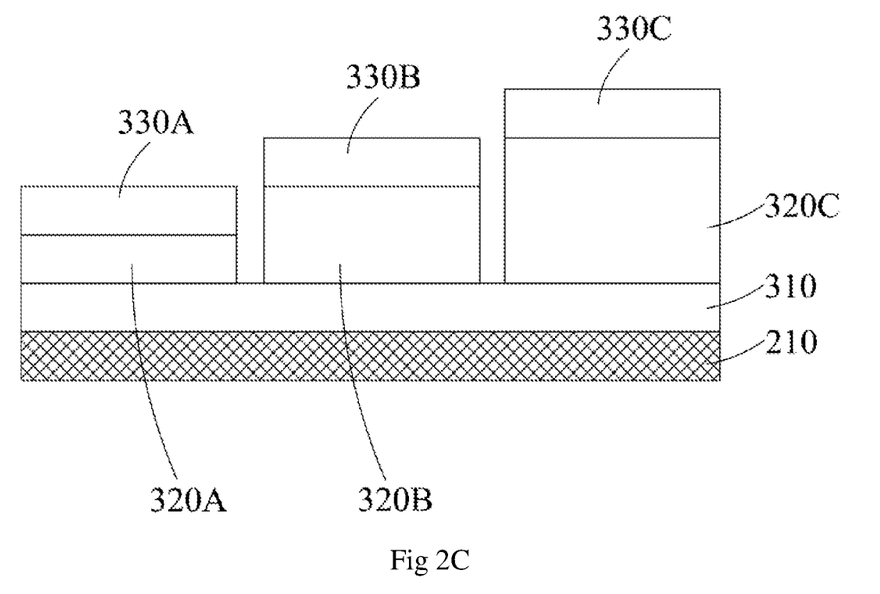

Please refer to FIG. 2B, hole transport layers 320A, 320B and 320C corresponding respectively to varies color lights emitted from emitting layers are manufactured on the hole injection layer 310 by lithography technologies on a needed thickness of resonance mode; wherein the hole transport layers 320A, 320B and 320C are isolated from each other. As shown in FIG. 2C, the emitting layers being able to emit different color lights comprise: a first emitting layer 330A capable of emitting red light, a second emitting layer 330B capable of emitting green light, and a third emitting layer 330C capable of emitting blue light. Detailed description of the hole transport layers 320A, 320B and 320C is illustrated as following. However, it should be understood that the sequence of the hole transport layers 320A, 320B and 320C is not limited in the present disclosure.

FIG. 3A~FIG. 3F represent process diagrams of hole transport layers corresponded to a first emitting layer according to an embodiment of the present disclosure.

Figure 3A:
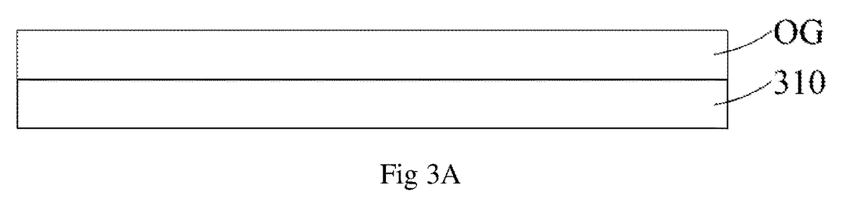
FIG. 3A~FIG. 3F represent process diagrams of hole transport layers corresponded to a first emitting layer according to an embodiment of the present disclosure.

Please refer to FIG. 3A, an organic material layer OG is evaporated on the hole injection layer 310 according to the needed thickness of the resonance mode for the hole transport layer 320A corresponding to the first emitting layer 330A.

Figure 3B:
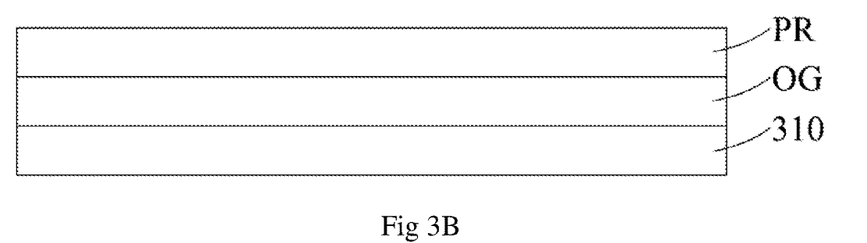

Please refer to FIG. 3B, a photoresist layer PR is coated on the organic material layer OG. Here, the photoresist layer is made from negative photoresist materials.

Figure 3C:
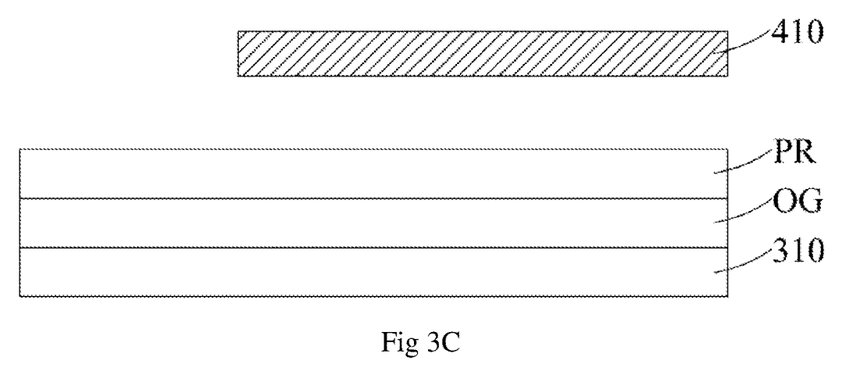

Please refer to FIG. 3C, the photoresist layer PR is developed by a first photomask 410; wherein the first photomask 410 is partially light transparent and partially (the rest of the first photomask) opaque to the first emitting layer 330A.

Figure 3D:
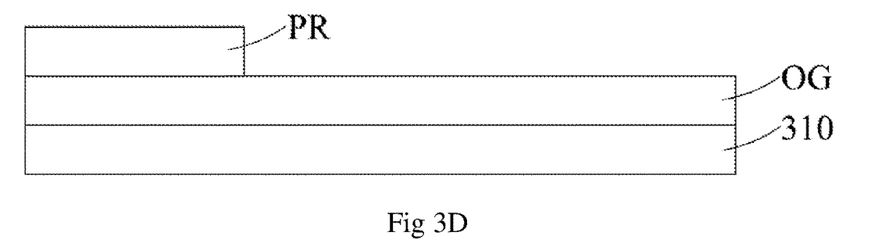

Please refer to 3D, the photoresist layer PR is developed after exposing to remove the un-exposing photoresist layer PR. The developer applied herein is compatible with the organic material layer OG applied herein, and the organic material layer OG is not damaged from the developer.

Figure 3E:
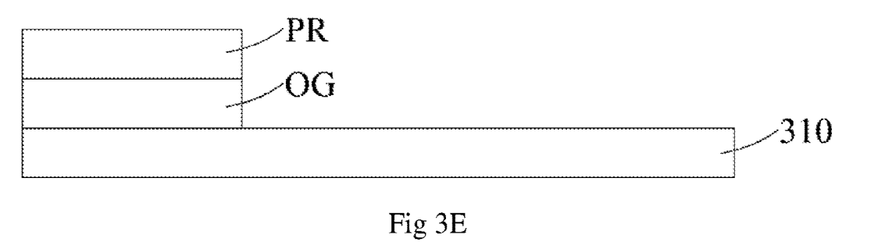

Please refer to 3E, the organic material layer uncovered by the photoresist layer OG is etching.

Figure 3F:
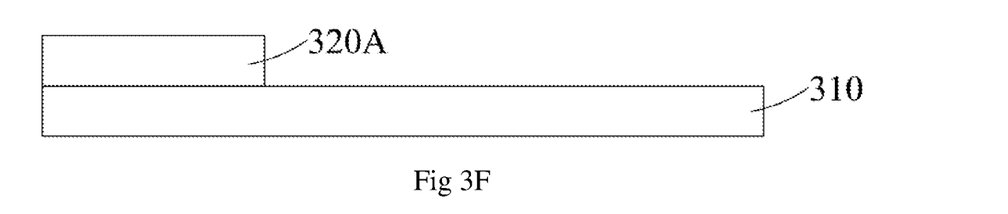

Please refer to FIG. 3F, the exposing photoresist layer PR is isolated to form the hole transport layer 320A corresponding to the first emitting layer 330A. The developer applied herein is compatible with the organic material layer OG applied herein, and the organic material layer OG is not damaged from the developer.

FIG. 4A~FIG. 4F represent process diagrams of hole transport layers corresponded to a second emitting layer according to an embodiment of the present disclosure.

Figure 4A:
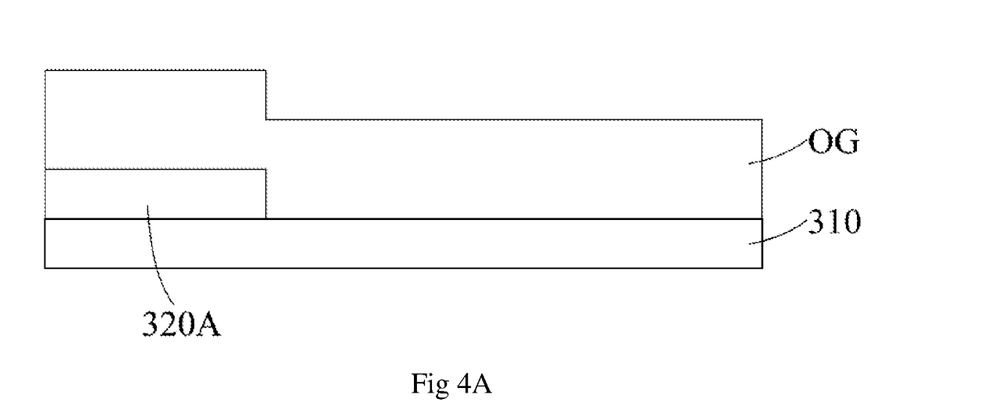
FIG. 4A~FIG. 4F represent process diagrams of hole transport layers corresponded to a second emitting layer according to an embodiment of the present disclosure.

Please refer to FIG. 4A, an organic material layer OG is evaporated on the hole injection layer 310 according to the needed thickness of the resonance mode for the hole transport layer 320B corresponding to the second emitting layer 330B. The needed thickness of the resonance mode for the hole transport layer 320B corresponding to the second emitting layer 330B is larger than the needed thickness of the resonance mode for the hole transport layer 320A corresponding to the first emitting layer 330A.

Figure 4B:
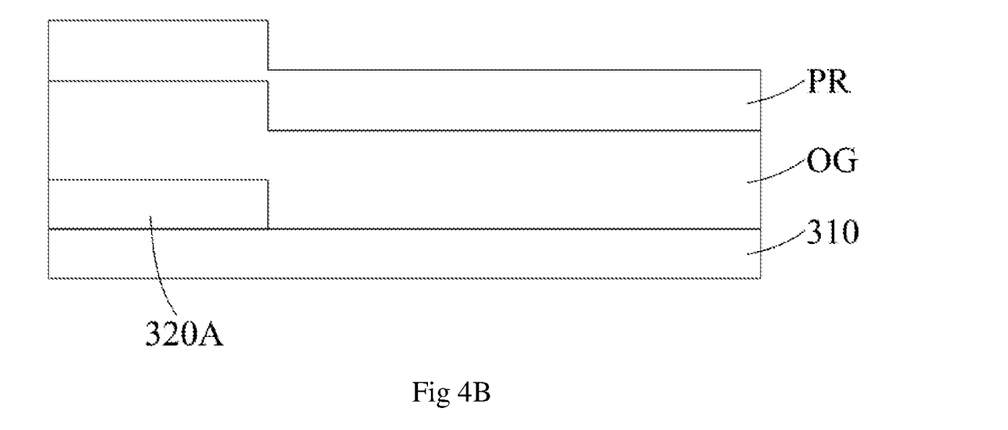

Please refer to FIG. 4B, a photoresist layer PR is coated on the organic material layer OG. Here, the photoresist layer is made from negative photoresist materials.

Figure 4C:
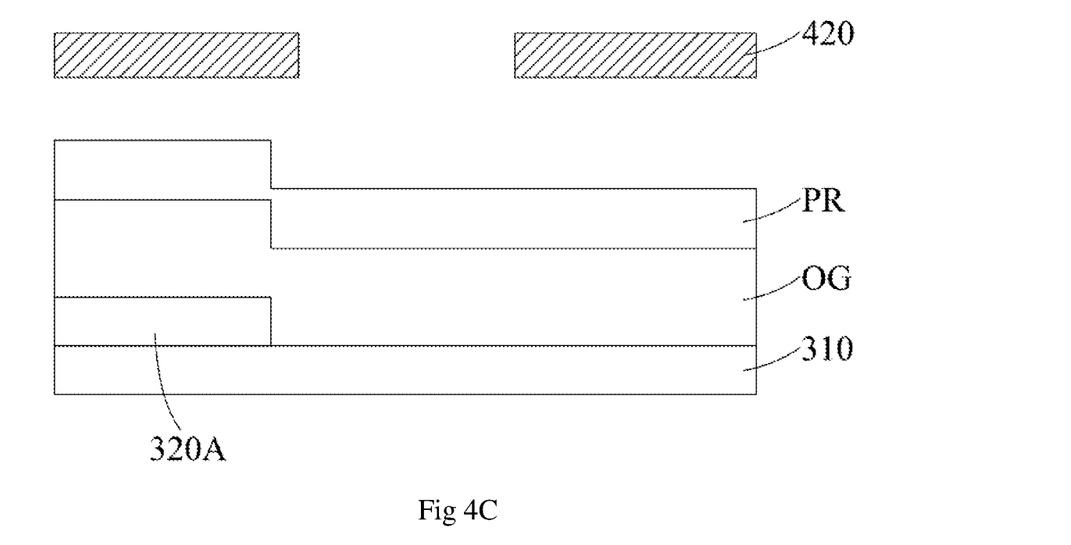

Please refer to FIG. 4C, the photoresist layer PR is developed by a second photomask 420; wherein the second photomask 420 is partially light transparent and partially (the rest of the first photomask) opaque to the second emitting layer 330B.

Figure 4D:
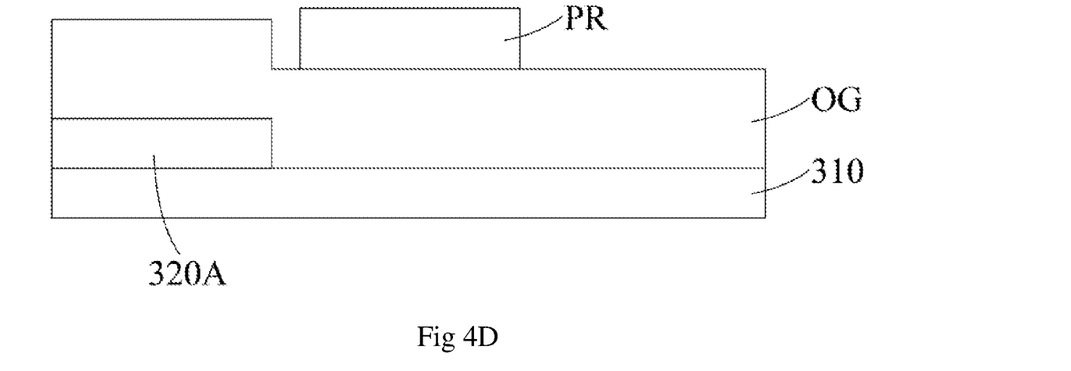

Please refer to 4D, the photoresist layer PR is developed after exposing to remove the un-exposing photoresist layer PR. The developer applied herein is compatible with the organic material layer OG applied herein, and the organic material layer OG is not damaged from the developer.

Figure 4E:
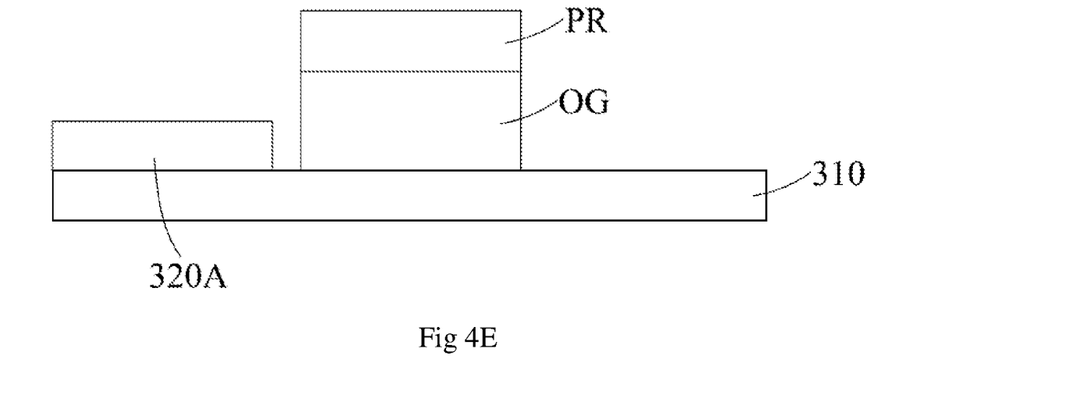

Please refer to 4E, the organic material layer OG uncovered by the photoresist layer PR is etched.

Figure 4F:
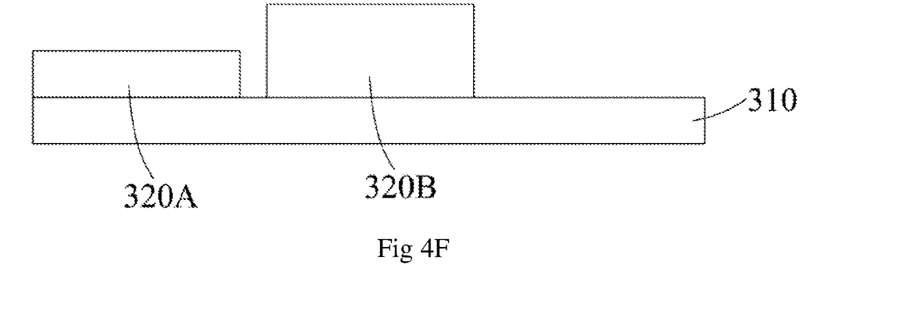

Please refer to FIG. 4F, the exposing photoresist layer PR is isolated to form the hole transport layer 320B corresponding to the second emitting layer 330B. The developer applied herein is compatible with the organic material layer OG applied herein, and the organic material layer OG is not damaged from the developer.

FIG. 5A~FIG. 5F represent process diagrams of hole transport layers corresponded to a third emitting layer according to an embodiment of the present disclosure.

Figure 5A:
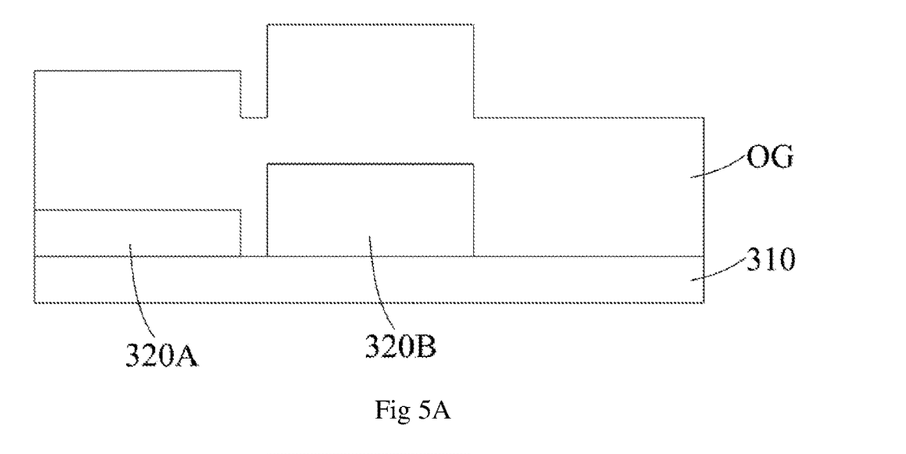
FIG. 5A~FIG. 5F represent process diagrams of hole transport layers corresponded to a third emitting layer according to an embodiment of the present disclosure.

Please refer to FIG. 5A, an organic material layer OG is evaporated on the hole injection layer 310 according to the needed thickness of the resonance mode for the hole transport layer 320C corresponding to the third emitting layer 330C. The needed thickness of the resonance mode for the hole transport layer 320C corresponding to the third emitting layer 330C is larger than the needed thickness of the resonance mode for the hole transport layer 320B corresponding to the second emitting layer 330B.

Figure 5B:
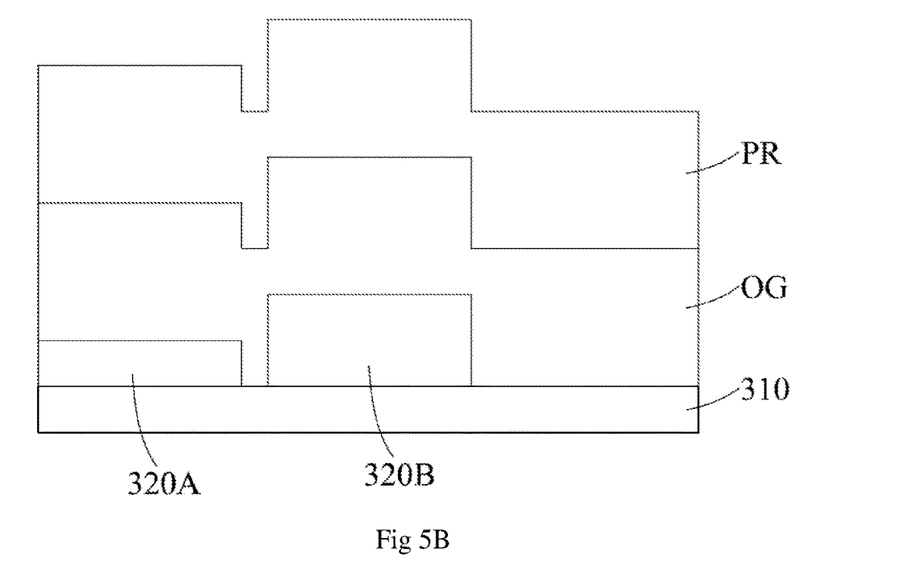

Please refer to FIG. 5B, a photoresist layer PR is coated on the organic material layer OG. Here, the photoresist layer is made from negative photoresist materials.

Figure 5C:
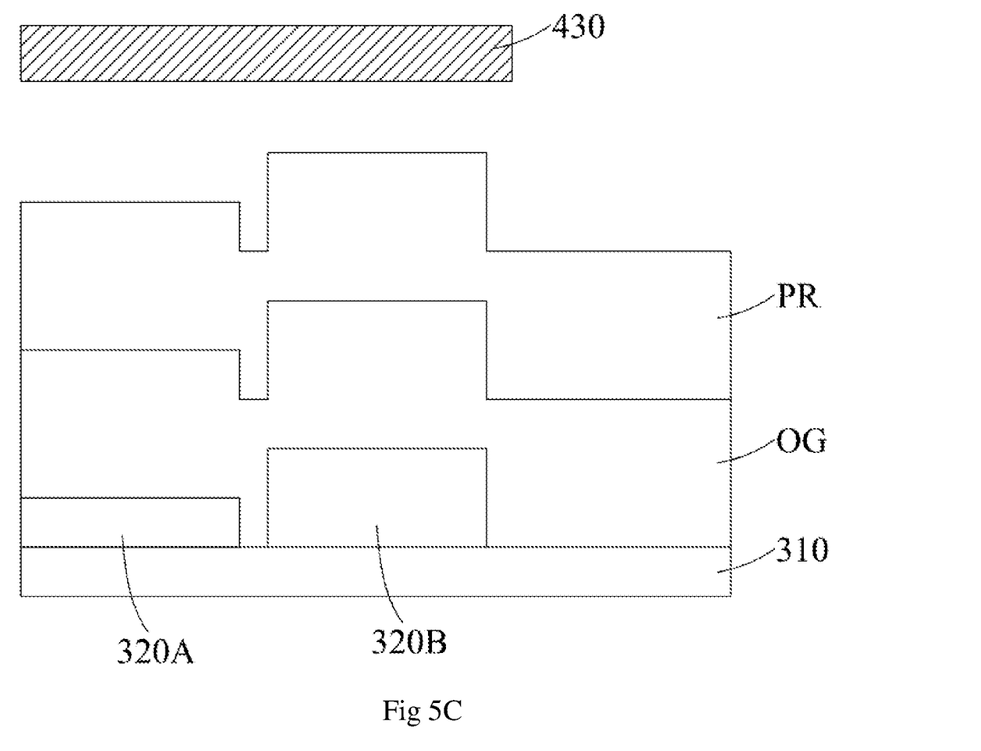

Please refer to FIG. 5C, the photoresist layer PR is developed by a third photomask 430; wherein the third photomask 430 is partially light transparent and partially (the rest of the first photomask) opaque to the second emitting layer 330C.

Figure 5D:
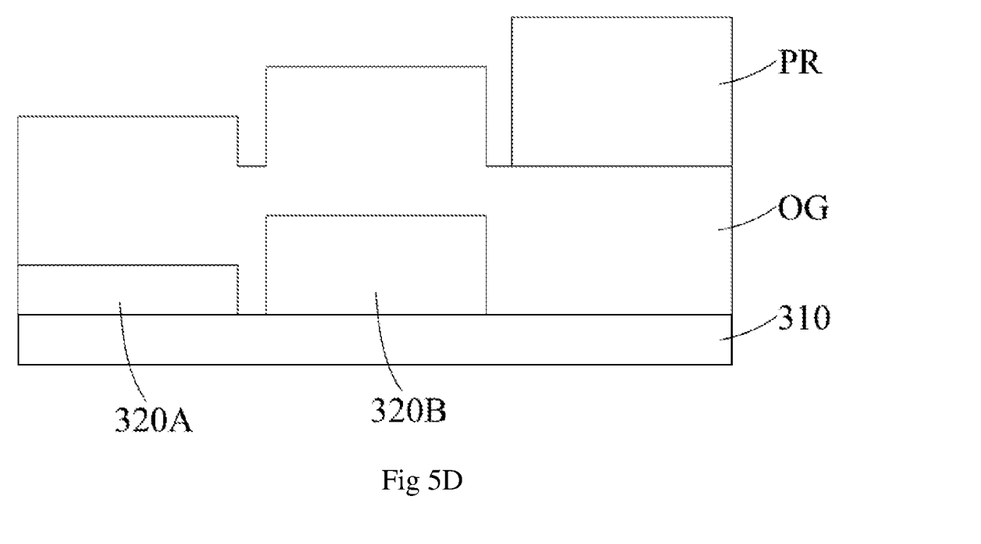

Please refer to 5D, the photoresist layer PR is developed after exposing to remove the un-exposing photoresist layer PR. The developer applied herein is compatible with the organic material layer OG applied herein, and the organic material layer OG is not damaged from the developer.

Figure 5E:
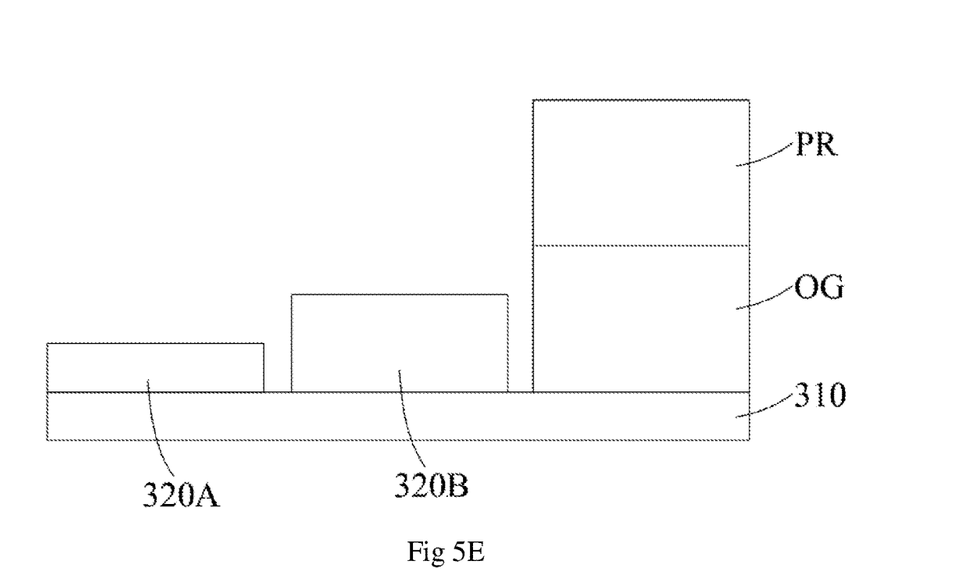

Please refer to 5E, the organic material layer OG uncovered by the photoresist layer PR is etched.

Figure 5F:
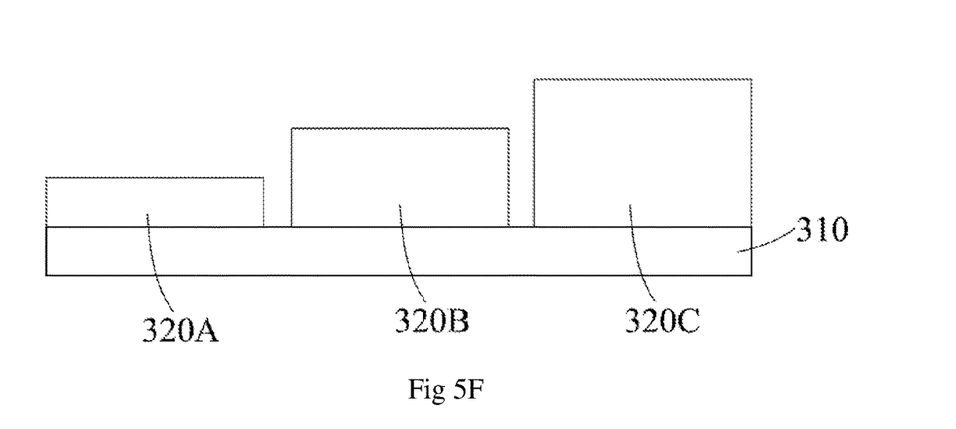

Please refer to FIG. 5F, the exposing photoresist layer PR is isolated to form the hole transport layer 320C corresponding to the third emitting layer 330C. The developer applied herein is compatible with the organic material layer OG applied herein, and the organic material layer OG is not damaged from the developer.

A manufacturing method of an organic electro-emitting assembly is continuing to be illustrated hereinafter.

Please continue referring to FIG. 2C, each corresponding emitting layer is evaporated on each hole transport layer. In the present embodiment, a first emitting layer 330A is evaporated on the hole transport layer 320A, a second emitting layer 330B is evaporated on the hole transport layer 320B, and a third emitting layer 330C is evaporated on the hole transport layer 320C. Wherein, the first emitting layer 330A, the second emitting layer 330B and the third emitting layer 330C can be formed by evaporation simultaneously or separately. Because of hole-electron recombination, the first emitting layer 330A, the second emitting layer 330B and the third emitting layer 330C can emit corresponding color light respectively herein.

Figure 2D:
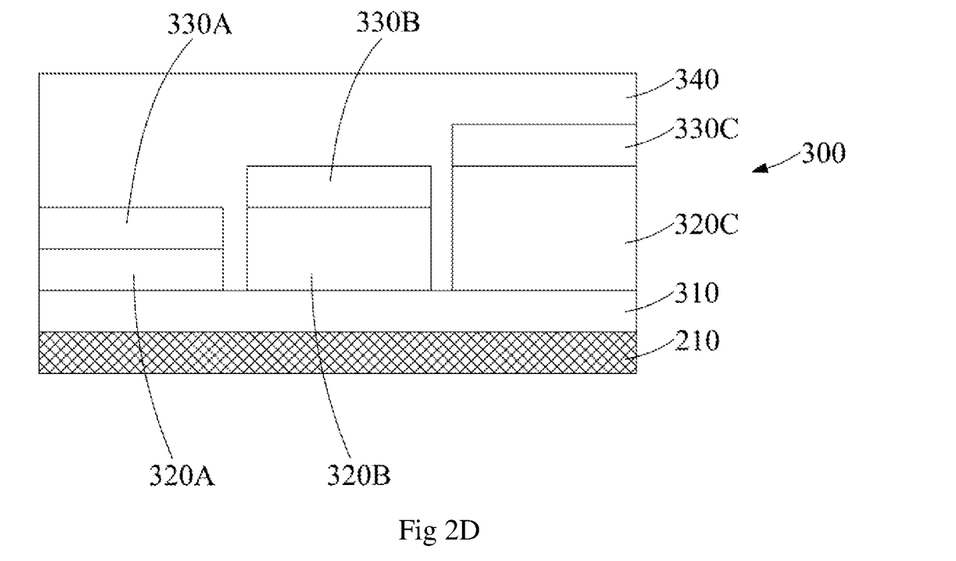

Please refer FIG. 2D, the electron transport layer 340 is evaporated on each emitting layers respectively at the same time.

Figure 2E:
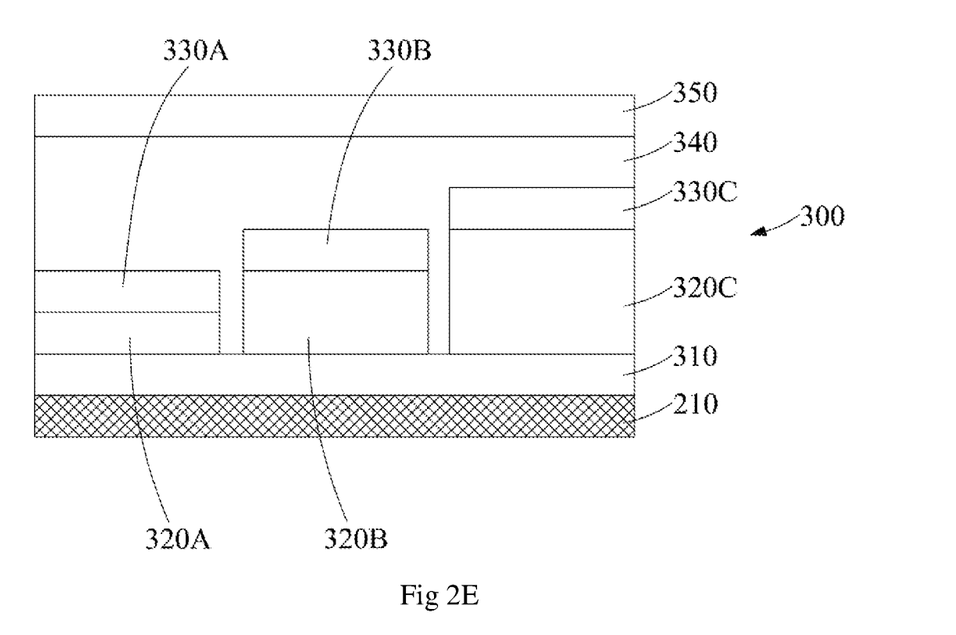

Please refer to FIG. 2E, the electron injection layer 350 is evaporated on the electron transport layer 340.

A manufacturing method of an embodiment regarding to an organic electro-emitting assembly in the present disclosure is shown in FIG. 2A~FIG. 2E, but the organic electro-emitting assembly of the present disclosure is limited hereto in the structures manufactured method shown in FIG. 2A~FIG. 2E. However, it should be noted that every emitting layers should be existing in the organic electro-emitting assembly.

The manufacturing method of the organic light emitting device in the embodiment of the present disclosure is continuing to be described in detail in the following.

Please continue referring to FIG. 1C, a top electrode 220 is manufacturing on the electron injection layer 350 of the organic electro-emitting assembly 300.

The top electrode 220 is usually disposed as anode. The top electrode is also a reflective mirror. When observing emitting from the organic electro-emitting assembly through the top electrode 220, the top electrode 220 can be made of reflective metal and should be able to thin enough to comprise partial transparency rate under emitting-light wave; this is so called semi-transparent. Or the top electrode 220 can be made of transparent metal oxides, for example: Indium-Tin-Oxide or Zinc-Tin-Oxide. When observing emitting from the organic electro-emitting assembly through the base substrate 100, the top electrode 220 is made of reflective metal, and the top electrode 220 should be thick enough to stop light passing and to be a light-reflective mirror hereto.

In view of the above-described embodiments, according to the organic light emitting device and the manufacturing method thereof in the embodiments of the present disclosure, hole transport layers manufactured by lithography technologies are corresponding to every emitting layer; therefore, no fine metal mask is needed in use to reduce production cost and time; furthermore, properties of the organic light emitting device is increased simultaneously.

Although the present disclosure is described with reference to the special exemplary, these should not be construed as limiting the scope of the embodiment but as merely providing illustrations of some of the presently preferred embodiment. Rather, the scope of the invention is to be determined only by the appended claims and their equivalents.

The invention claimed is:

1. A manufacturing method of organic light emitting device, wherein steps hereof comprising:
    manufacturing a bottom electrode on a base substrate;
    manufacturing an organic electro-emitting assembly on the bottom electrode by evaporation techniques and lithography techniques, including
    evaporating a hole injection layer on the bottom electrode;
    manufacturing hole transport layers corresponding respectively to varies color lights emitted from emitting layers on the hole injection layer by lithography technologies on a needed thickness of resonance mode;
    evaporating corresponding emitting layers on the hole transport layers;
    evaporating an electron transport layer on the emitting layer;
    evaporating an electron injection layer on the electron transport layer; and
    manufacturing a top electrode on the organic electro-emitting assembly.

2. The manufacturing method of claim 1, wherein the emitting layers capable of emitting varies color lights comprise: a first emitting layer capable of emitting red light, a second emitting layer capable of emitting green light and a third emitting layer capable of emitting blue light.

3. The manufacturing method of claim 2, wherein the step of the method of manufacturing the hole transport layer corresponding to red color lights emitted by lithography technologies on the hole injection layer on the needed thickness of resonance mode comprises:
    evaporating an organic material layer on the hole injection layer according to the needed thickness of the resonance mode for the hole transport layer corresponding to the first emitting layer;
    coating a photoresist layer on the organic material layer;
    developing the photoresist layer by a first photomask, wherein the first photomask is partially light transparent and partially (the rest of the first photomask) opaque to the first emitting layer;
    developing the photoresist layer after exposing to remove the un-exposing photoresist layer;
    etching the organic material layer uncovered by the photoresist layer; and
    isolating the exposing photoresist layer to form the hole transport layer corresponding to the first emitting layer.

4. The manufacturing method of claim 3, wherein the photoresist layer is made from negative photoresist materials.

5. The manufacturing method of claim 3, wherein the needed thickness of the resonance mode for the hole transport layer corresponding to the third emitting layer is larger than the needed thickness of the resonance mode for the hole transport layer corresponding to the second emitting layer, and the needed thickness of the resonance mode for the hole transport layer corresponding to the second emitting layer is larger than the needed thickness of the resonance mode for the hole transport layer corresponding to the first emitting layer.

6. The manufacturing method of claim 2, wherein the step of the method of manufacturing the hole transport layer corresponding to the second emitting layer emitting green light by lithography technologies on the needed thickness of resonance mode for the hole injection layer comprises:
    evaporating an organic material layer on the hole injection layer according to the needed thickness of the resonance mode for the hole transport layer corresponding to the second emitting layer;
    coating a photoresist layer on the organic material layer;
    developing the photoresist layer by a second photomask, wherein the second photomask is partially light transparent and partially (the rest of the second photomask) opaque to the second emitting layer;
    developing the photoresist layer after exposing to remove the un-exposing photoresist layer;
    etching the organic material layer uncovered by the photoresist layer; and
    isolating the exposing photoresist layer to form the hole transport layer corresponding to the second emitting layer.

7. The manufacturing method of claim 6, wherein the photoresist layer is made from negative photoresist materials.

8. The manufacturing method of claim 6, wherein the needed thickness of the resonance mode for the hole transport layer corresponding to the third emitting layer is larger than the needed thickness of the resonance mode for the hole transport layer corresponding to the second emitting layer, and the needed thickness of the resonance mode for the hole transport layer corresponding to the second emitting layer is larger than the needed thickness of the resonance mode for the hole transport layer corresponding to the first emitting layer.

9. The manufacturing method of claim 2, wherein, the step of the method of manufacturing the hole transport layer corresponding to the third emitting layer emitting green light by lithography technologies on the needed thickness of resonance mode for the hole injection layer comprises:
    evaporating an organic material layer on the hole injection layer according to the needed thickness of the resonance mode for the hole transport layer corresponding to the third emitting layer;
    coating a photoresist layer on the organic material layer;
    developing the photoresist layer by a third photomask, wherein the third photomask is partially light transparent and partially (the rest of the third photomask) opaque to the third emitting layer;
    developing the photoresist layer after exposing to remove the un-exposing photoresist layer;
    etching the organic material layer uncovered by the photoresist layer;
    isolating the exposing photoresist layer to form the hole transport layer corresponding to the third emitting layer.

10. The manufacturing method of claim 9, wherein the photoresist layer is made from negative photoresist materials.

11. The manufacturing method of claim 9, wherein the needed thickness of the resonance mode for the hole transport layer corresponding to the third emitting layer is larger than the needed thickness of the resonance mode for the hole transport layer corresponding to the second emitting layer, and the needed thickness of the resonance mode for the hole transport layer corresponding to the second emitting layer is larger than the needed thickness of the resonance mode for the hole transport layer corresponding to the first emitting layer.

12. The manufacturing method of claim 2, wherein the needed thickness of the resonance mode for the hole transport layer corresponding to the third emitting layer is larger than the needed thickness of the resonance mode for the hole transport layer corresponding to the second emitting layer, and the needed thickness of the resonance mode for the hole transport layer corresponding to the second emitting layer is larger than the needed thickness of the resonance mode for the hole transport layer corresponding to the first emitting layer.

13. The manufacturing method of claim 1, wherein one of the bottom electrode and the top electrode is transparent or semi-transparent, and the other one is opaque and reflective.

14. An organic light emitting device is manufactured by the manufacturing method of organic light emitting device of claim 1.

* * * * *